(12) United States Patent
Shibata et al.

(10) Patent No.: US 10,074,585 B2
(45) Date of Patent: Sep. 11, 2018

(54) POWER MODULE WITH DUMMY TERMINAL STRUCTURE

(71) Applicant: Mitsubishi Electric Corporation, Tokyo (JP)

(72) Inventors: Shogo Shibata, Tokyo (JP); Maki Hasegawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/529,568

(22) PCT Filed: Jan. 20, 2015

(86) PCT No.: PCT/JP2015/051314
§ 371 (c)(1),
(2) Date: May 25, 2017

(87) PCT Pub. No.: WO2016/117015
PCT Pub. Date: Jul. 28, 2016

(65) Prior Publication Data
US 2017/0345733 A1 Nov. 30, 2017

(51) Int. Cl.
*H01L 23/367* (2006.01)
*H01L 23/50* (2006.01)
(Continued)

(52) U.S. Cl.
CPC .......... *H01L 23/3672* (2013.01); *H01L 23/50* (2013.01); *H01L 25/072* (2013.01); *H01L 25/18* (2013.01)

(58) Field of Classification Search
CPC ... H01L 23/3672; H01L 25/072; H01L 23/50; H01L 25/18; H01L 23/367; H01L 25/07
(Continued)

(56) References Cited

U.S. PATENT DOCUMENTS

| 5,672,910 A | 9/1997 | Majumdar et al. |
| 5,834,842 A | 11/1998 | Majumdar et al. |

(Continued)

FOREIGN PATENT DOCUMENTS

| AU | 3195397 A | * | 1/1998 |
| JP | 04-049647 A | | 2/1992 |

(Continued)

OTHER PUBLICATIONS

International Search Report issued in PCT/JP2015/051314; dated Mar. 31, 2015.

(Continued)

*Primary Examiner* — Alexander Oscar Williams
(74) *Attorney, Agent, or Firm* — Studebaker & Brackett PC

(57) ABSTRACT

A power module includes a connection terminal for external connection, the connection terminal protruding from the side surface of a package, and a dummy terminal protruding from the side surface of the package and shorter than the connection terminal. The dummy terminal is processed to have a bottom surface with an inclination. In other words, the distance between a plane containing a heat dissipation surface of the package and the dummy terminal increases toward the extremity of the dummy terminal. Accordingly, when a heat dissipation fin is attached to the heat dissipation surface, the extremity of the dummy terminal is more distant from the heat dissipation fin than the rest of the dummy terminal.

6 Claims, 3 Drawing Sheets

(51) Int. Cl.
  *H01L 25/07* (2006.01)
  *H01L 25/18* (2006.01)
(58) Field of Classification Search
  USPC ....... 257/706, 707, 712, 713, 717, 721, 666, 257/696, 698
  See application file for complete search history.

(56) References Cited

U.S. PATENT DOCUMENTS

| | | | |
|---|---|---|---|
| 5,877,548 A * | 3/1999 | Washida | H01L 23/49541 257/666 |
| 5,910,010 A * | 6/1999 | Nishizawa | H01L 21/565 257/E21.504 |
| 5,912,592 A * | 6/1999 | Kikushima | H03H 9/0542 331/158 |
| 6,084,309 A | 7/2000 | Kawashima et al. | |
| 6,165,819 A | 12/2000 | Seki et al. | |
| 6,462,424 B1 | 10/2002 | Seki et al. | |
| 6,734,551 B2 | 5/2004 | Yoshihara et al. | |
| 6,818,971 B2 * | 11/2004 | Oda | H01L 23/49575 257/667 |
| 9,666,512 B2 * | 5/2017 | Im | H01L 23/49575 |
| 2003/0001244 A1 * | 1/2003 | Araki | H01L 21/568 257/666 |
| 2005/0104792 A1 * | 5/2005 | Asao | H01Q 13/10 343/767 |
| 2008/0308913 A1 * | 12/2008 | Park | H01L 23/49555 257/666 |
| 2010/0164078 A1 * | 7/2010 | Madrid | H01L 23/3107 257/675 |
| 2011/0215400 A1 * | 9/2011 | Nakamura | H01L 29/66 257/334 |
| 2011/0284989 A1 * | 11/2011 | Umeno | H01L 23/495 257/531 |
| 2013/0082334 A1 * | 4/2013 | Nakamura | H01L 23/49524 257/401 |
| 2015/0332992 A1 * | 11/2015 | Im | H01L 25/16 257/139 |

FOREIGN PATENT DOCUMENTS

| | | |
|---|---|---|
| JP | 05-326796 A | 12/1993 |
| JP | 09-153574 A | 6/1997 |
| JP | 09-199645 A | 7/1997 |
| JP | 10-303358 A | 11/1998 |
| JP | 2000-188371 A | 7/2000 |
| JP | 2003-124437 A | 4/2003 |
| JP | 2008-166642 A | 7/2008 |
| JP | 3195397 U | 12/2014 |
| WO | 2009/081494 A1 | 7/2009 |

OTHER PUBLICATIONS

Notification of Transmittal of Translation of the International Preliminary Report on Patentability and Translation of Written Opinion of the International Searching Authority; PCT/JP2015/051314; dated Aug. 3, 2017.

An Office Action; "Notification of Reasons for Refusal," mailed by the Japanese Patent Office dated Mar. Mar. 13, 2018, which corresponds to Japanese Patent Application No. 2016-570232 and is related to U.S. Appl. No. 15/529,568; with its English translation.

* cited by examiner

F I G. 6
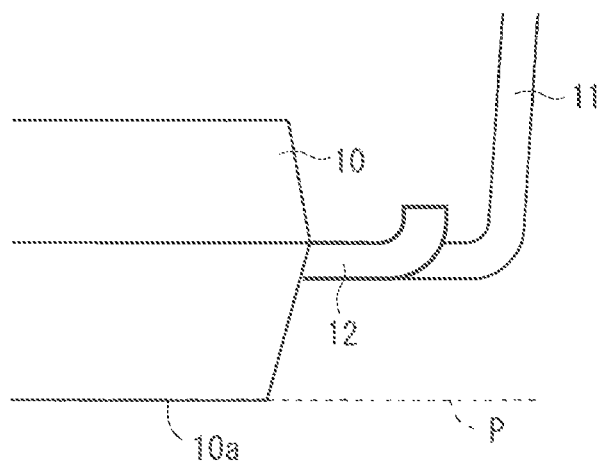
F I G. 7
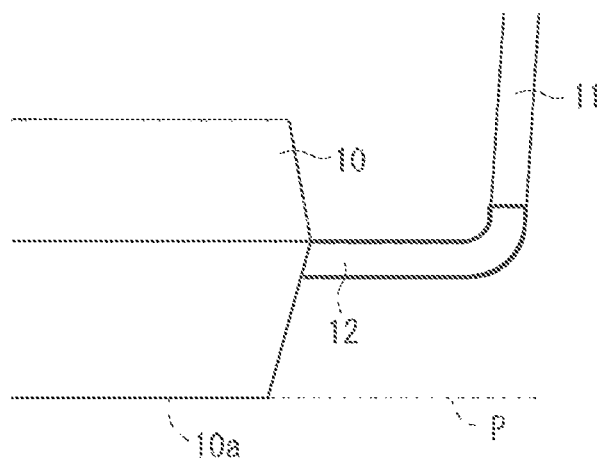

POWER MODULE WITH DUMMY TERMINAL STRUCTURE

TECHNICAL FIELD

The present invention relates to structures of power modules, and particularly, to a structure of a dummy terminal included in a power module.

BACKGROUND ART

A power semiconductor device (power module) is provided with a dummy terminal that includes a shortened ground pin (GND pin) and a shortened power-supply pin, for an optimal inner structure and simple wires on a substrate. The dummy terminal is used as a "suspension lead" in an assembly step for the power module, and achieves stable manufacture.

The power module, which receives a high voltage when practically used, involves in a great rise in temperature. Thus, a fin for cooling needs to be attached to the power module in most cases. A heat dissipation fin of the power module is typically, often connected to a ground potential for use. Hence, the power module requires a high dielectric strength between its individual terminals and the fin. This holds true for the dummy terminal as well.

The terminals of the power module are each commonly made through the punching of a lead frame. Hence, the terminal sags at the side surfaces, and thus has obtuse angles at the edges of both sides. On the other hand, the terminal has, at the extremity, corners of three directions. Thus, the extremity is easily processed to have an acute angle. A terminal having a sharp portion likely, intensively receives electric fields at this sharp portion. This possibly causes degradation in dielectric strength.

Proposed are various techniques for improving the dielectric strength between the terminal and heat-dissipation fin of the power module (e.g., Patent Documents 1 and 2 below).

PRIOR ART DOCUMENTS

Patent Documents

Patent Document 1: Japanese Patent Application Laid-Open No. 9-153574
Patent Document 2: Japanese Patent Application Laid-Open No. 2008-166642

SUMMARY OF INVENTION

Problem to be Solved by the Invention

When the extremity of a normal connection terminals is distant from the side surface of a package of the power module, electric discharge between the sharp part at the extremity of the dummy terminal and the heat dissipation fin attached to the bottom surface (heat-dissipation surface) of the package occurs easily. This obstructs the improvement of the dielectric strength.

The techniques of Patent Documents 1 and 2 improve the dielectric strength. Unfortunately, these techniques require an additional insulator between the terminal and the heat dissipation fin, and also require processing of the shape of the package or heat dissipation fin for proper placement of the insulator. This results in an increase in component and an increase in manufacture step, to thus raise manufacture cost.

Another effort is made to cut the dummy terminal along the side surface of the package, so that the extremity of the dummy terminal does not protrude from the package. Unfortunately, in this method, it is difficult for the extremity of the dummy terminal not to protrude from the package without fail because the package cracks due to a stress applied to the package during the cut of the dummy terminal or because of variations in position for the cut of the dummy terminal.

The present invention is made to solve these problems. It is an object of the present invention to provide a power module that achieves a high dielectric strength between a dummy terminal and a heat dissipation fin while minimizing an increase in manufacture cost.

Means for Solving the Problem

A power module according to the present invention includes a package having a bottom surface serving as a heat dissipation surface, a connection terminal for external connection, the connection terminal protruding from a side surface of the package, and a dummy terminal protruding from the side surface of the package and shorter than the connection terminal. At least an end of the dummy terminal is shaped in such a manner that the dummy terminal is more distant from a plane containing the heat dissipation surface toward an extremity of the dummy terminal.

Effects of the Invention

The power module according to the present invention is configured such that when a heat dissipation fin is attached to the heat dissipation surface, the extremity of the dummy terminal, which is likely to intensively receive electric fields, is more distant from the heat dissipation fin than the rest of the dummy terminal. Such a configuration improves a dielectric strength between the dummy terminal and the heat dissipation fin. Such a configuration also eliminates an increase in component and the need for processing the shape of the package or heat dissipation fin to thus minimize an increase in manufacture cost.

These and other objects, features, aspects and advantages of the present invention will become more apparent from the following detailed description of the present invention when taken in conjunction with the accompanying drawings.

BRIEF DESCRIPTION OF DRAWINGS

FIG. 6 is a diagram of a structure of the dummy terminal of the power module according to a third embodiment.
FIG. 7 is a diagram of a structure of the dummy terminal of the power module according to a fourth embodiment.

DESCRIPTION OF EMBODIMENTS

First Embodiment

Figure 1:
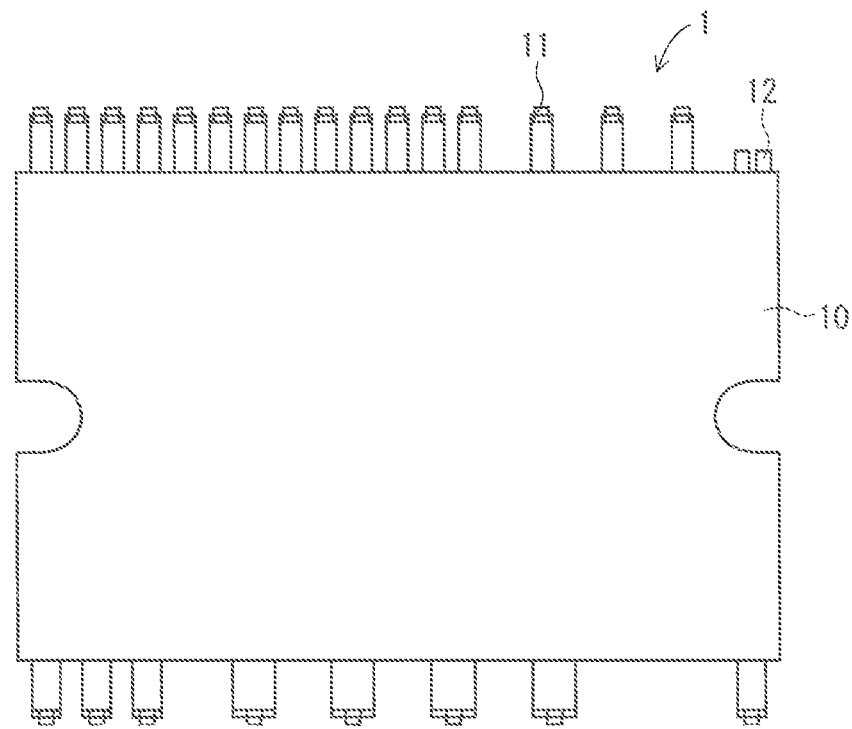
FIG. 1 is a top view of a power module according to embodiments of the present invention.

FIG. 1 is a top view of a power module according to embodiments of the present invention. A power module 1 includes a package 10 made of molding resin and sealing a semiconductor element (not shown), connection terminals 11 and dummy terminals 12, each provided so as to protrude from the side surfaces of the package 10. The connection terminal 11 is used for external connection. The dummy terminal 12 is not practically used, and is used as a "suspension lead" in an assembly step for instance. The dummy terminal 12 is not intended for use in external connection, and is thus shorter than the connection terminal 11 (the dummy terminal 12 protrudes from the package 10 less than the connection terminal 11).

Figure 2:
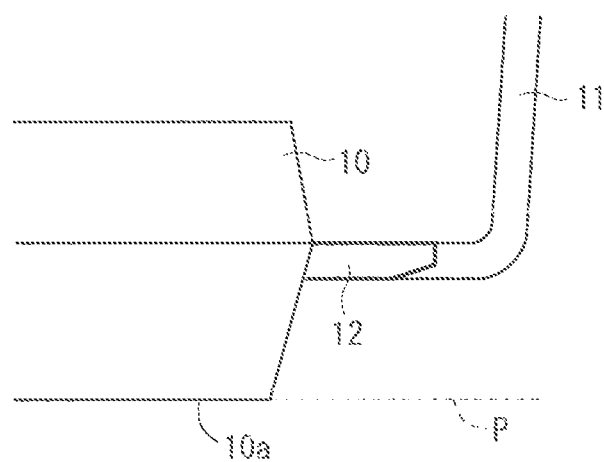
FIG. 2 is a diagram of a structure of a dummy terminal of a power module according to a first embodiment.

FIG. 2 is a view of a structure of the dummy terminal 12 of the power module 1 according to a first embodiment, and is an enlarged side view of a portion of the power module 1, in which the dummy terminal 12 is disposed. Here, in the power module 1, the bottom surface (not shown in FIG. 1) of the package 10 serves as a heat dissipation surface 10a to which a cooling fin is to be attached.

In the first embodiment, the dummy terminal 12 is processed, at the end, to have an inclined bottom surface as illustrated in FIG. 2. That is, the distance between a plane P containing the heat dissipation surface 10a of the package 10 and the dummy terminal 12 increases toward the extremity of the dummy terminal 12. Here, the plane P containing the heat dissipation surface 10a is in parallel with and flush with the heat dissipation surface 10a of the package 10. For instance, when a heat dissipation fin that is wider than the package 10 and has a flat top surface is attached to the heat dissipation surface 10a, the plane P is flush with the top surface of the heat dissipation fin. Accordingly, when the heat dissipation fin is attached to the heat dissipation surface 10a, the extremity of the dummy terminal 12 is more distant from the heat dissipation fin than the rest of the dummy terminal 12.

Figure 3:
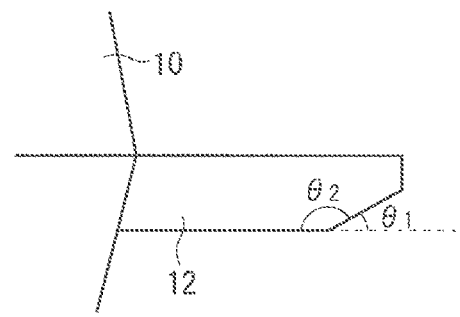
FIG. 3 is an enlarged view of the dummy terminal of the power module according to the first embodiment.

FIG. 3 is an enlarged view of the dummy terminal 12. The inclined portion at the bottom surface of the dummy terminal 12 is set to have an angle of inclination $\theta_1$ in a range of $0°<\theta_1<90°$. Accordingly, the inclined portion in the dummy terminal 12 and a non-inclined portion in the dummy terminal 12 form an angle $\theta_2$ in a range of $90°<\theta_2<180°$, i.e., an obtuse angle.

According to the first embodiment, the end of the dummy terminal 12 has no sharp portions. This prevents electric fields from being concentrated in the extremity of the dummy terminal 12 to thus improve a dielectric strength between the dummy terminal 12 and the heat dissipation fin. In addition, the increase in distance between the end of the dummy terminal 12, which is likely to intensively receive the electric fields, and the heat dissipation fin also improves the dielectric strength between the dummy terminal 12 and the heat dissipation fin. Moreover, the power module 1 eliminates an increase in component and the need for processing the shape of the package or heat dissipation fin, when compared with a conventional power module. This minimizes an increase in manufacture cost.

FIG. 2 and FIG. 3 illustrate a configuration in which the inclined portion is disposed at only the end of the dummy terminal 12. In some embodiments, the inclined portion is disposed at the entire bottom of the dummy terminal 12.

Examples of how to form the inclined portion in the dummy terminal 12 include grinding the bottom surface of dummy terminal 12 with a grinder, and punching a lead frame with a mold having a preformed inclination in a portion corresponding to the dummy terminal 12, in a punching process.

Second Embodiment

Figure 4:
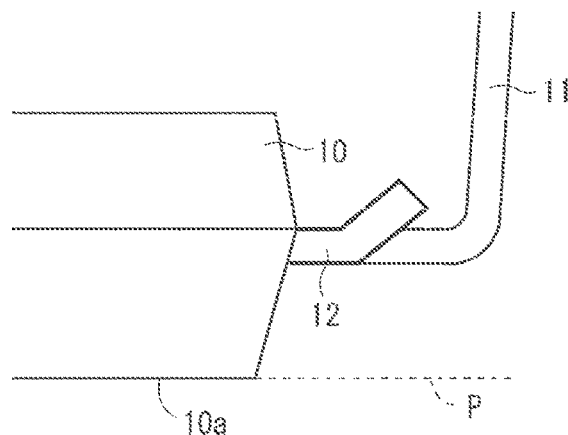
FIG. 4 is a diagram of a structure of the dummy terminal of the power module according to a second embodiment.

FIG. 4 is a diagram of a structure of the dummy terminal 12 of the power module 1 according to a second embodiment, and is an enlarged side view of a portion in the power module 1, in which the dummy terminal 12 is disposed.

In the second embodiment, the dummy terminal 12 is processed to be partly bent upward (in a direction away from the plane P containing the heat dissipation surface 10a), as illustrated in FIG. 4. Accordingly, the distance between the plane P containing the heat dissipation surface 10a of the package 10 and the dummy terminal 12 increases toward the extremity of the dummy terminal 12. Thus, when the heat dissipation fin is attached to the heat dissipation surface 10a, the extremity of the dummy terminal 12 is more distant from the heat dissipation fin than the rest of the dummy terminal 12. Consequently, like in the first embodiment, the dielectric strength between the dummy terminal 12 and the heat dissipation fin is improved.

Figure 5:
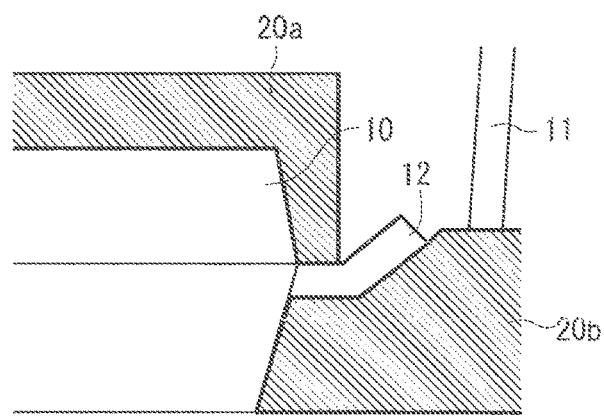
FIG. 5 illustrates an example of how to bend the dummy terminal.

How to bend the dummy terminal 12 is, for instance, pressing a press die 20b having an inclined surface against the lower surface of the dummy terminal 12 with a press die 20a brought into contact with the top surface of the dummy terminal 12, at its root portion, as illustrated in FIG. 5.

Third Embodiment

FIG. 6 is a view of a structure of the dummy terminal 12 of the power module 1 according to a third embodiment, and is an enlarged side view of a portion in the power module 1, in which the dummy terminal 12 is disposed.

As illustrated in FIG. 6, the dummy terminal 12 is processed to be partly bent upward (in a direction away from the plane P containing the heat dissipation surface 10a), like in the second embodiment. In the third embodiment, the bent portion of the dummy terminal 12 is curved. Consequently, the third embodiment enables the dummy terminal 12 to have fewer angular portions than the second embodiment, and further prevents the concentration of the electric fields than the second embodiment. As a result, the third embodiment further improves the dielectric strength between the dummy terminal 12 and the heat dissipation fin than the second embodiment.

How to curve the dummy terminal 12 is similar to that illustrated in FIG. 5. The angular portions of the press dies 20a and 20b simply need to be changed into curved portions.

Fourth Embodiment

FIG. 7 is a diagram of a structure of the dummy terminal 12 of the power module 1 according to a fourth embodiment, and is an enlarged side view of a portion in the power module 1, in which the dummy terminal 12 is disposed.

As illustrated in FIG. 7, the dummy terminal 12 is processed to be partly bent upward (in a direction away from the plane P containing heat dissipation surface 10a), like in the third embodiment. The bent portion of the dummy terminal 12 is curved. In the fourth embodiment, the dummy terminal 12 is longer than that in the third embodiment, and the bent portion of the dummy terminal 12 is disposed in a position corresponding to a bent portion of the connection terminal 11.

The fourth embodiment achieves the same effect as the third embodiment. Additionally, the fourth embodiment enables the bent portion of the dummy terminal 12 to be formed simultaneously with and in the same manner as the bent portion of the connection terminal 11. This simplifies manufacturing steps.

It is to be noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS

10 package, 10a heat dissipation surface, 11 connection terminal, 12 dummy terminal, 20a, 20b press die.

The invention claimed is:

1. A power module comprising:
a package comprising a bottom surface serving as a heat dissipation surface;
a connection terminal for external connection, said connection terminal protruding from a side surface of said package; and
a dummy terminal protruding from said side surface of said package, shorter than said connection terminal, and having an end portion including an extremity of said dummy terminal,
wherein at least the end portion of said dummy terminal becomes thinner with increasing distance from said package in such a manner that said dummy terminal is more distant from a plane containing said heat dissipation surface toward the extremity of said dummy terminal.

2. The power module according to claim 1, wherein at least said end portion of said dummy terminal comprises a bottom surface provided with an inclined portion, in such a manner that said dummy terminal is more distant from said plane containing said heat dissipation surface toward said extremity of said dummy terminal.

3. The power module according to claim 2, wherein said inclined portion has an angle of inclination of greater than 0° and less than 90°.

4. A power module comprising:
a package comprising a bottom surface serving as a heat dissipation surface;
a connection terminal for external connection, said connection terminal protruding from a side surface of said package; and
a dummy terminal protruding from said side surface of said package and shorter than said connection terminal, wherein
at least an end of said dummy terminal is shaped in such a manner that said dummy terminal is more distant from a plane containing said heat dissipation surface toward an extremity of said dummy terminal,
said dummy terminal comprises a bent portion bent in a direction away from said plane containing said heat dissipation surface, and
an entirety of the dummy terminal is spaced from said bottom surface and a top surface of said package.

5. The power module according to claim 4, wherein said bent portion of said dummy terminal is curved.

6. The power module according to claim 4, wherein said bent portion of said dummy terminal is disposed in a position corresponding to a bent portion of said connection terminal.

* * * * *